(12) United States Patent
Sugamoto et al.

(10) Patent No.: US 7,314,766 B2
(45) Date of Patent: Jan. 1, 2008

(54) SEMICONDUCTOR WAFER TREATMENT METHOD, SEMICONDUCTOR WAFER INSPECTION METHOD, SEMICONDUCTOR DEVICE DEVELOPMENT METHOD AND SEMICONDUCTOR WAFER TREATMENT APPARATUS

(75) Inventors: Junji Sugamoto, Kanagawa (JP); Norihiko Tsuchiya, Tokyo (JP); Yukihiro Ushiku, Kanagawa (JP); Katsujiro Tanzawa, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 102 days.

(21) Appl. No.: 10/706,090

(22) Filed: Nov. 13, 2003

(65) Prior Publication Data
US 2004/0137752 A1 Jul. 15, 2004

(30) Foreign Application Priority Data
Nov. 14, 2002 (JP) .............................. 2002-330683
Oct. 31, 2003 (JP) .............................. 2003-372019

(51) Int. Cl.
*H01L 21/00* (2006.01)

(52) U.S. Cl. ................ 438/8; 438/5; 438/7; 257/E21.53

(58) Field of Classification Search ................ 438/745, 438/689, 693, 704, 494, 498, 504, 734–735, 438/5, 7, 8; 216/56, 62, 103–109; 156/345.1, 156/345.11, 912–915; 257/E21.53
See application file for complete search history.

(56) References Cited

U.S. PATENT DOCUMENTS

| | | | | |
|---|---|---|---|---|
| 4,243,473 A | | 1/1981 | Yamaguchi et al. | |
| 5,534,112 A | * | 7/1996 | Fusegawa et al. | ............. 438/16 |
| 5,688,319 A | * | 11/1997 | Fusegawa et al. | ............. 117/13 |
| 5,968,264 A | * | 10/1999 | Iida et al. | ..................... 117/30 |
| 6,143,629 A | * | 11/2000 | Sato | ........................... 438/455 |
| 6,277,193 B1 | * | 8/2001 | Sadamitsu et al. | ............ 117/88 |
| 6,364,947 B1 | * | 4/2002 | Iida et al. | ................... 117/206 |
| 6,391,662 B1 | * | 5/2002 | Mule'Stagno et al. | ......... 438/8 |
| 6,638,357 B2 | * | 10/2003 | Mule'Stagno et al. | ......... 117/2 |
| 2002/0137343 A1 | * | 9/2002 | Wang et al. | ................ 438/689 |
| 2003/0113941 A1 | * | 6/2003 | Naruoka | ...................... 438/14 |
| 2005/0092348 A1 | * | 5/2005 | Chiang et al. | ................. 134/1 |

(Continued)

FOREIGN PATENT DOCUMENTS

JP 52-107247 9/1977

(Continued)

OTHER PUBLICATIONS

Younan et al. "Studies on stacking faults and crystalline defects in fabrication silicon wafer substrate" Semiconductor electronics, 1998 proceedings. 1998 IEEE international conference, Nov. 24, 1998, p. 1-8.*

(Continued)

*Primary Examiner*—Bradley K Smith
(74) *Attorney, Agent, or Firm*—Finnegan, Henderson, Farabow, Garrett & Dunner, L.L.P.

(57) ABSTRACT

A treatment method of a semiconductor wafer includes treating the semiconductor wafer in a first solution having at least one kind of an oxidative acid and an oxidizing agent and treating the semiconductor wafer in a second solution having at least one of HF and $NH_4F$.

23 Claims, 10 Drawing Sheets

U.S. PATENT DOCUMENTS

2005/0208322 A1* 9/2005 Barge et al. ............... 428/620

FOREIGN PATENT DOCUMENTS

| JP | 53-81066 | 7/1978 |
| JP | 08-191090 | 7/1996 |
| JP | 08-097263 | 12/1996 |
| JP | 9-199379 | 7/1997 |
| JP | 11-54579 | 2/1999 |
| JP | 2003-318242 | 7/2003 |

OTHER PUBLICATIONS

Younan et al. "Improvement of 155 Wright etch and its application in failure analysis in line qbd failure in wafer fabrication"Semiconductor electronics, 1998 proceedings. 1998 IEEE international conference, Dec. 21, 2002, p. 188-190.*

Japanese Patent Office Action mailed by the Japanese Patent Office on Oct. 18, 2005 in counterpart Japanese Application No. 2003-372019.

* cited by examiner

SEMICONDUCTOR WAFER TREATMENT METHOD, SEMICONDUCTOR WAFER INSPECTION METHOD, SEMICONDUCTOR DEVICE DEVELOPMENT METHOD AND SEMICONDUCTOR WAFER TREATMENT APPARATUS

CROSS REFERENCE TO RELATED APPLICATION

This application claims benefit of priority under 35USC §119 to Japanese Patent Applications No. 2002-330683, filed on Nov. 14, 2002 and No. 2003-372019, filed on Oct. 31, 2003, the contents of which are incorporated by reference herein.

BACKGROUND OF THE INVENTION

1. Field of the Invention

The present invention relates to a treatment method and inspection method of a semiconductor wafer on which a device pattern is formed, a semiconductor device development method and a semiconductor wafer treatment apparatus, and it relates, for example, to a quantitative evaluation and pretreatment of a crystal defect such as a dislocation occurred on the semiconductor wafer.

2. Related Background Art

During manufacture of a semiconductor device, heat stress and film stress occurring in a device manufacturing process lead to a dislocation which deteriorates characteristics of the semiconductor device and causes such troubles as in a leak current and a breakdown voltage. To develop processes in which no dislocations occur, a wafer (TEG (Test Element Group) wafer) on which a semiconductor device is manufactured has heretofore been divided into a plurality of chips as shown in FIG. 14. A device film structure on a chip selected as a sample is removed by use of a chemical solution and subjected to selective etching to let out a crystal defect (dislocation), and then an etch pit is evaluated by use of a scanning electron microscope (hereinafter simply referred to as an SEM), an optical microscope and the like to qualitatively find the defect, thereby correcting process conditions, circuit patterns and the like on the basis of the evaluation.

It should be noted that the selective etching generally makes it possible to observe various kinds of crystal defects such as an oxidation-induced stacking fault (OSF) and a bulk micro defect (EMD) present in a wafer due to an oxygen precipitated material or the like, but evaluation of a dislocation mainly induced in a process will be described below as an example.

Furthermore, as disclosed in Japanese Patent Laid Open (kokai) No. 11 (1999)-54579 (FIG. 1 and p. 3) and Japanese Patent Laid Open (kokai) No. 8 (1996)-191090 (p. 5 to p. 7, FIG. 1), evaluation of a crystal defect in a state of a semiconductor wafer is also known, but both of the disclosures offer evaluation of a semiconductor wafer state before a device is formed.

The evaluation method described above in which the semiconductor is divided into pieces takes time for evaluation and provides a narrow evaluation range, so that when a dislocation occurs unevenly in a semiconductor wafer surface and when a dislocation occurs at a density below a certain density, frequent overlooking takes place and there is a lack of quantitativity, thus posing a problem that the evaluation can not be used as a guideline for process improvement. Other than the method described above, means for a wide-ranging evaluation of the dislocation caused in the device manufacturing process include an X-ray topograph method. However, this method provides a low resolution of several um whereas the design rule has been reduced (to 0.1 um) due to high integration of recent devices, which makes minute dislocations to be overlooked, thus making the method unusable after all. Further, since the X-ray is used, penetration depth thereof is several um even by use of a reflection method (Berg-Barrett method), it is thus difficult to take out only dislocations in a device active area, the recent depth of which is 1 um or less.

Next, observation by microscope of an etch pit of a dislocation due to the selective etching, which is carried out when a quantitative evaluation is made on a crystal defect such as dislocation, and data analysis thereof will be described.

In a manufacturing process of a semiconductor device using a silicon single crystal substrate, a crystal defect (dislocation) occurs depending on a three-dimensional structure (shape, size, film thickness) of a device and on process conditions, which is a cause of a leak system trouble. The cause of this dislocation is dependent on a pattern and process of a product. Such cases are reported that the dislocation has been caused formerly by stress during oxidation of LOCOS, and even by excessive stress of an embedded material ($SiO_2$) in recent STI (shallow trench isolation). On the other hand, the dislocation often occurs due to implantation of ions which are one kind of charged particles and also due to plasma damage. An LDD (lightly doped drain) process in a transistor will be mainly described here. However, it is noted that the crystal defect in the present specification is not limited to the process described above but includes all dislocations introduced to a product or a semiconductor wafer during manufacture.

A recent MOS transistor needs an LDD structure to prevent deterioration due to hot electrons, and as shown in FIG. 15A, for example, when source/drain areas are formed, a spacer (hereinafter referred to as a sidewall) 201 of a silicon nitride film (SiN) or the like is utilized as a sidewall material for a gate to form a low concentration impurities area prior to a high concentration impurities area. This increases stress of a lower part of the sidewall, and a dislocation occurs in order to reduce this stress, and the dislocation further grows as shown in FIG. 15B to penetrate a diffusion area and a well joint.

Furthermore, a long expanding dislocation (hereinafter abbreviated as a dislocation) that runs into a depletion layer increases a leak current and has an influence on a yield ratio of elements. In addition, in a silicon semiconductor substrate having source/drain areas for a micro device, dislocations can often occur on a periphery of edges of gate conductors and wires where ions are implanted in a large dose amount in a process where silicon amorphousized by ion implantation is recrystallized during activation anneal.

A method of enabling direct observation by use of a TEM (transmission electron microscope) is a typical evaluation method of the dislocation, but an observation area within a semiconductor wafer surface is significantly small, which poses a disadvantage that there is a risk of mistaking an overall tendency. On the contrary, heretofore, such a technique has long been adopted wherein the etch pit (see FIG. 15C) created by etching in a chemical solution which has high selectivity to the dislocation is detected and counted by use of the microscope (optical microscope, SEM). However, the number of chips that can be observed a day through manual labor by an operator is several chips at most within a surface per semiconductor wafer, giving a limit in terms of time. Therefore, such a method has been conceived that utilizes an automatic defect evaluation device to detect a defect by use of the optical and electronic microscope and to judge and extract the defect with a calculator algorithm for image recognition. However, if such an automatic defect evaluation device is applied to pit observation after the same kind of selective etching, the following problems are caused.

With regard to positions where the dislocation occurs, stress extremely concentrates on a periphery of a point (crossing point) at which the gate conductor and an element separation oxide film (such as LOCOS, improved LOCOS, STI) cross, and in a worst case, the dislocation may occur in all cells including a transistor and the like. The reason why the dislocation (crystal defect induced in a process) occurs and grows on the highly integrated device is that local high stress is applied during heat treatment. Therefore, these dislocations generally occur in the same place of the device pattern which is repeated periodically. For example, as shown in FIG. 16, with regard to evaluation of a dislocation located in an evaluation area EA201 of a pattern within a observed chip, when evaluation is performed by use of an image recognition method in which a reference area RA201 in an adjacent pattern or adjacent chip is compared with the evaluation area EA201 by an automatic evaluation so as to extract a difference between them, the patterns both having a dislocation in the same place are compared, as a result, a judgement "no defect" is made in this case. Current devices using such a method (die-to-die or cell-to-cell) in which the reference area and evaluation area are compared might make an erroneous judgment even when many etch pits are actually caused, because images that are much the same are compared, and it has thus been difficult to detect, count and evaluate the dislocations without omission.

It should be noted that the term "defect" is used in a broad sense in the present specification, and includes foreign particles (minute particles and film residuals) on the semiconductor wafer, abnormal shape portions, and portions having abnormalities in shape, light intensity and color.

BRIEF SUMMARY OF THE INVENTION

According to a first aspect of the present invention, there is provided a treatment method of a semiconductor wafer, comprising:

treating the semiconductor wafer in a first solution including at least one kind of an oxidative acid and an oxidizing agent; and treating the semiconductor wafer in a second solution including at least one of HF and $NH_4F$.

According to a second aspect of the present invention, there is provided a treatment method of the semiconductor wafer, comprising:

treating the semiconductor wafer in a first solution including at least one of $NH_4F$ and HF whose concentration is 33% to 49%; and treating the semiconductor wafer in a second solution including at least one of an alkali, an oxidative acid and HF.

According to a third aspect of the present invention, there is provided a method of inspecting a semiconductor wafer which comprises a film constituting a device structure including a device pattern and which may have a crystal defect, the method comprising:

removing the film with a chemical solution to expose the crystal surface of the semiconductor wafer;

selectively removing a surface layer of the semiconductor wafer by selective etching to bring the crystal defect into view; and quantitatively evaluating the crystal defect.

According to a fourth aspect of the present invention, there is provided a method of developing a semiconductor device, comprising:

removing a film with a chemical solution, the film being formed on a crystal surface of a semiconductor wafer which may have a crystal defect, and the film constituting a device structure including a device pattern, so that the crystal surface of the semiconductor wafer is exposed;

selectively removing a surface layer of the semiconductor wafer by selective etching to bring the crystal defect into view, quantitatively evaluating the crystal defect; and optimizing a manufacturing process for the semiconductor device or the shape of the device pattern on the basis of information on the crystal defect obtained from the quantitative evaluation so that the crystal defect is reduced.

According to a fifth aspect of the present invention, there is provided a semiconductor wafer treatment apparatus, comprising:

a first device to remove with a chemical solution a film of a semiconductor wafer which may have a crystal defect, so as to expose a crystal surface of the semiconductor wafer, the film constituting a device structure including a device pattern; and a second device to selectively remove a surface layer of the semiconductor wafer by selective etching to bring the crystal defect into view.

DETAILED DESCRIPTION OF THE INVENTION

Several embodiments of the present invention will hereinafter be described in greater detail in reference to the drawings. In the following embodiments, a "dislocation" which is one kind of line defect in an atomic arrangement will be described as a typical crystal defect of a semiconductor crystal constituting a substrate. However, other crystal defects (stacking fault (such as OSF)) and void defects can likewise be evaluated, and an evaluation in the present specification includes evaluation for these other crystal defects. The "dislocation" can be brought into view as an etch pit having a major axis of about 0.1 um to about 10 um by etching.

(1) First Embodiment

A first embodiment will be described in reference to FIG. 1 to FIG. 3.

Figure 1:
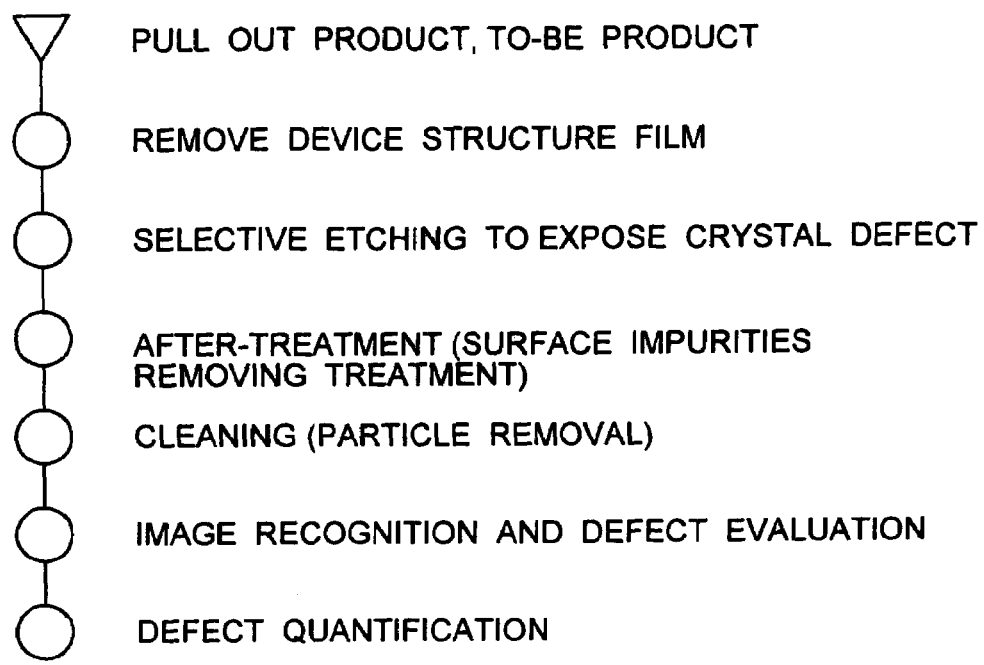
FIG. 1 is a flowchart showing a schematic procedure of a first embodiment of a semiconductor wafer inspection method according to the present invention.
Figure 3:
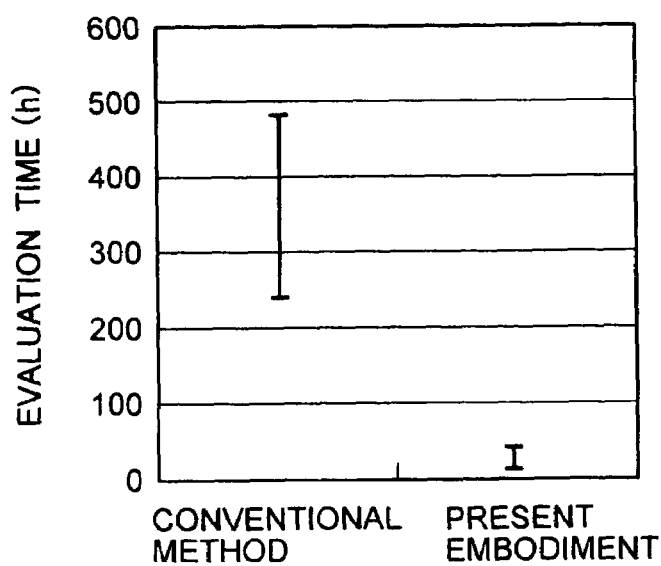
FIG. 3 is a characteristic graph showing length of evaluation time according to the inspection method shown in FIG. 1 in contrast with a conventional crystal defect evaluation method.
Figure 2:
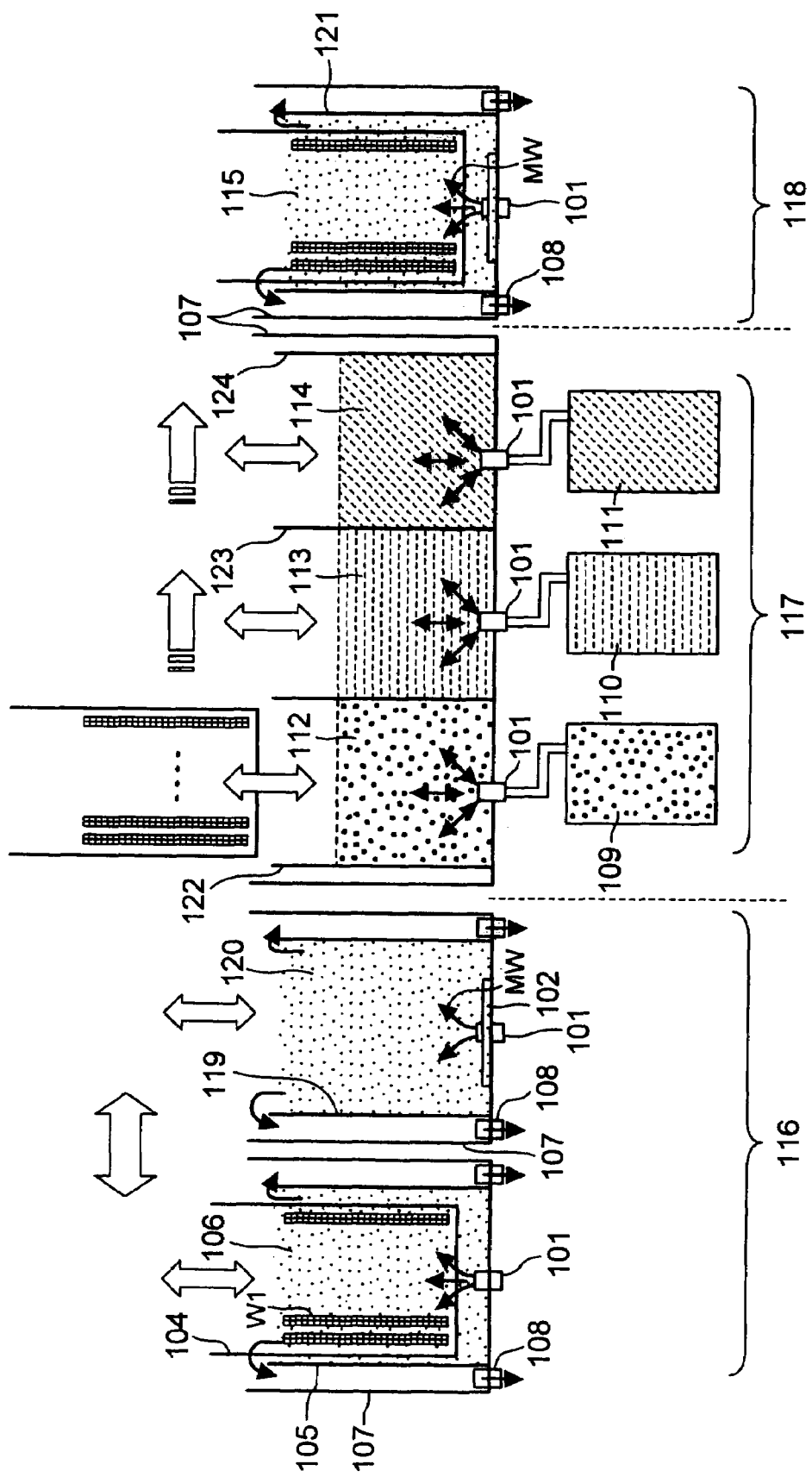
FIG. 2 is a cross sectional view showing the first embodiment of a semiconductor wafer treatment apparatus according to the present invention.

FIG. 1 is a flowchart showing a schematic procedure of the first embodiment of a semiconductor wafer inspection method according to the present invention, and FIG. 2 is a cross sectional view showing the first embodiment of a semiconductor wafer treatment apparatus according to the present invention, and further, FIG. 3 is a characteristic graph showing length of evaluation time according to the inspection method of the present embodiment in contrast with a conventional crystal defect evaluation method.

An application to a fault analysis of a plurality of memory products created in a design rule 0.18 um process will be described. In order to produce this semiconductor device, a semiconductor wafer on which a device pattern is formed is evaluated in accordance with the evaluation flow shown in FIG. 1. A sample (TEG wafer) is pulled out from the semiconductor wafers on which the memory products are manufactured, and a film constituting a device structure of the sample (device film structure) is removed. Next, selective etching for exposing a crystal defect such as a dislocation is carried out to expose an etch pit. Subsequently, after-treatment to remove surface impurities and cleaning to remove particles are carried out, evaluation is then made by image recognition using an SEM and an optical microscope to quantify the defect.

Evaluation of the dislocation mainly induced in a process will hereinafter be described as an example. However, it should be noted that the selective etching generally makes it possible to observe not only the dislocation but also various kinds of crystal defects such as an oxidation-induced stacking fault (OSF) and oxygen precipitates (BMD), and the present embodiment includes evaluation of these various kinds of crystal defects.

To prepare the sample before the image recognition defect evaluation, a treatment apparatus shown in FIG. 2 is used, and crystal defects appear as the etch pits in all areas within a semiconductor wafer surface.

First, a semiconductor wafer (TEG wafer) on which a device pattern is formed is selected as a sample. Then, a device structure film of the selected semiconductor wafer is removed.

The device structure film is removed in a device structure film removing process 116 shown in FIG. 2. In this process, a removal tank 105 made of Teflon (registered trademark) or the like and a removal tank 119 made of quartz or the like are set. These removal tanks 105, 119 are accommodated in their outer tanks (Teflon) 107. The outer tank 107 comprises a liquid injection port 101 and a liquid discharge port 108. First, a semiconductor wafer W1 on which the device pattern is formed is set to a wafer holding jig 104, and dipped for 15 minutes in a concentrated HF solution (49% HF:$H_2O$=1:2 (interfacial active agent NCW 1%)) (removal liquid 106) which has been filled in advance in the removal tank 105, and it is overflowed while being replaced with purified water, thereby removing an removed material lifted off by HF. After that, remaining films are removed by applying ultrasonic waves MV for 30 minutes in a dilute HF solution (49% HF:$H_2O$=1:100, (interfacial active agent NCW 1%)) in the removal tank 119. Next, it is replaced with purified water. When Cu is contained in the device structure film before removal, an SPM (sulfuric-hydrogen peroxide mixture) ($H_2SO_4$:$H_2O_2$=2:5) is filled in the removal tank 105, and the film is etched for 30 minutes, and then purified water replacement is carried out.

Subsequently, purified water is filled in the removal tank 119, and the semiconductor wafer W1 is put on standby in the purified water, and then dipped for 30 minutes to 12 hours in the concentrated HF solution (49% HF:$H_2O$=1:2 (interfacial active agent NCW 1%)) (removal liquid 106) in the removal tank 105 so as to remove all the device structure film, thereby exposing a silicon surface. Next, purified water replacement is carried out, the semiconductor wafer W1 is cleaned by applying the ultrasonic waves MV for 30 minutes in the dilute HF solution (49% HF:$H_2O$=1:100, (interfacial active agent NCW 1%)) in the removal tank 119. This process has a high cleaning effect if an alkaline cleaning liquid (such as choline, $NH_4OH$) is substituted. Purified water replacement is again carried out, thus finishing the removal process.

Next, the selective etching is carried out to expose the crystal defects. The selective etching is carried out in a crystal defect exposure etching process 117. This process is conducted using a Cr mixed acid tank 122, a primary cleaning tank 123 and a secondary cleaning tank 124 that are accommodated in an outer tank (Teflon) 107 made of Teflon or the like.

In the crystal defect exposure etching process 117, a wright liquid (proportion of HF (60 ml):$HNO_3$ (30 ml):CU ($NO_3$) (2 g):5 mol $CrO_3$ (30 ml):$CH_3COOH$ (60 ml):$H_2O$ (60 ml)) is supplied from the liquid injection port 101 to the Cr mixed acid tank 122, and the selective etching is carried out for 5 seconds. After the selective etching, the wafer holding jig 104 is lifted up, and the semiconductor wafer W1 is dipped for 30 seconds in the primary cleaning tank 123 in which $H_2O$ has been filled in advance, thus stopping the selective etching. Subsequently, the semiconductor wafer W1 is dipped for 30 seconds in the secondary cleaning tank 124 to clean Cr. Primary cleaning water 110 and secondary cleaning water 111 are supplied in the primary cleaning tank 123 and the secondary cleaning tank 124 via injection ports 101, 101, respectively. The liquids in the crystal defect exposure etching process 117 are collected by a Cr mixed acid collecting container 109 because they contain Cr.

In a next cleaning process 118, the wafer holding jig 104 is put into a cleaning tank 121 in which a cleaning liquid (purified water) 115 is overflowing, and cleaning is further carried out with water. A slight amount of Cr is removed by the SPM ($H_2SO_4:H_2O_2=2:5$), and then the semiconductor wafer W1 is cleaned by applying ultrasonic waves for 15 minutes in the dilute HF solution (49% $HF:H_2O=1:5$). Subsequently, the semiconductor wafer W1 is cleaned with an APM ($NH_4OH/H_2O_2/H_2O$) containing ozone water or with an HPM (hydrogen chloride-hydrogen peroxide mixture) ($HCl/(H_2O_2)/H_2O$), and cleaned with water, and then dried with a spin drier. By the above processes, the crystal defect can be exposed in a state where almost no particles are sticking onto the entire wafer surface. Detection sensitivity of an image recognition defect evaluation device is adjusted, and the semiconductor wafer is evaluated by comparison of images, thus obtaining the number of etch pits on the entire semiconductor wafer, and their shape, coordinates and scattering intensity.

Through these processes, the crystal defect on the entire semiconductor water on which the device pattern is formed can be quantitatively evaluated. As a result of quantitatively evaluation to the crystal defect, evaluation time can be reduced to 1/6-1/30 as compared with a conventional method as shown in FIG. 3, thereby making it possible to investigate the cause of a fault in a short period of time.

(2) Second Embodiment

Next, a second embodiment will be described in reference to FIG. 4 to FIG. 6.

The present embodiment is intended to reduce other etch pits and particles that become noise for the etch pits of a defect to be quantified, and to quantify them with high accuracy, so that the first embodiment described above is applied to development of logic products produced in processes under the design rule of 0.13 um.

Figure 4:
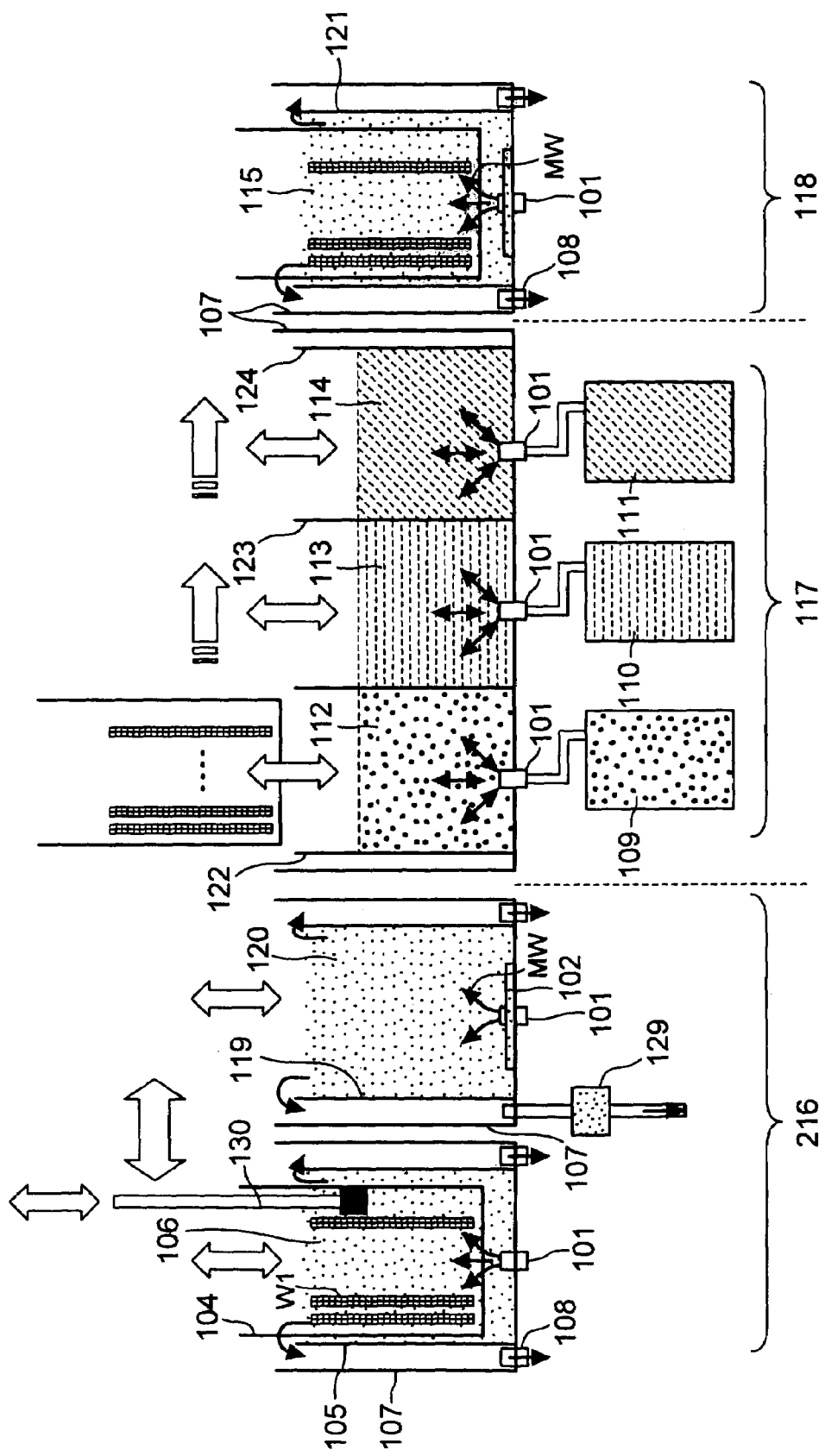
FIG. 4 is a cross sectional view showing a second embodiment of the semiconductor wafer treatment apparatus according to the present invention.
Figure 5:
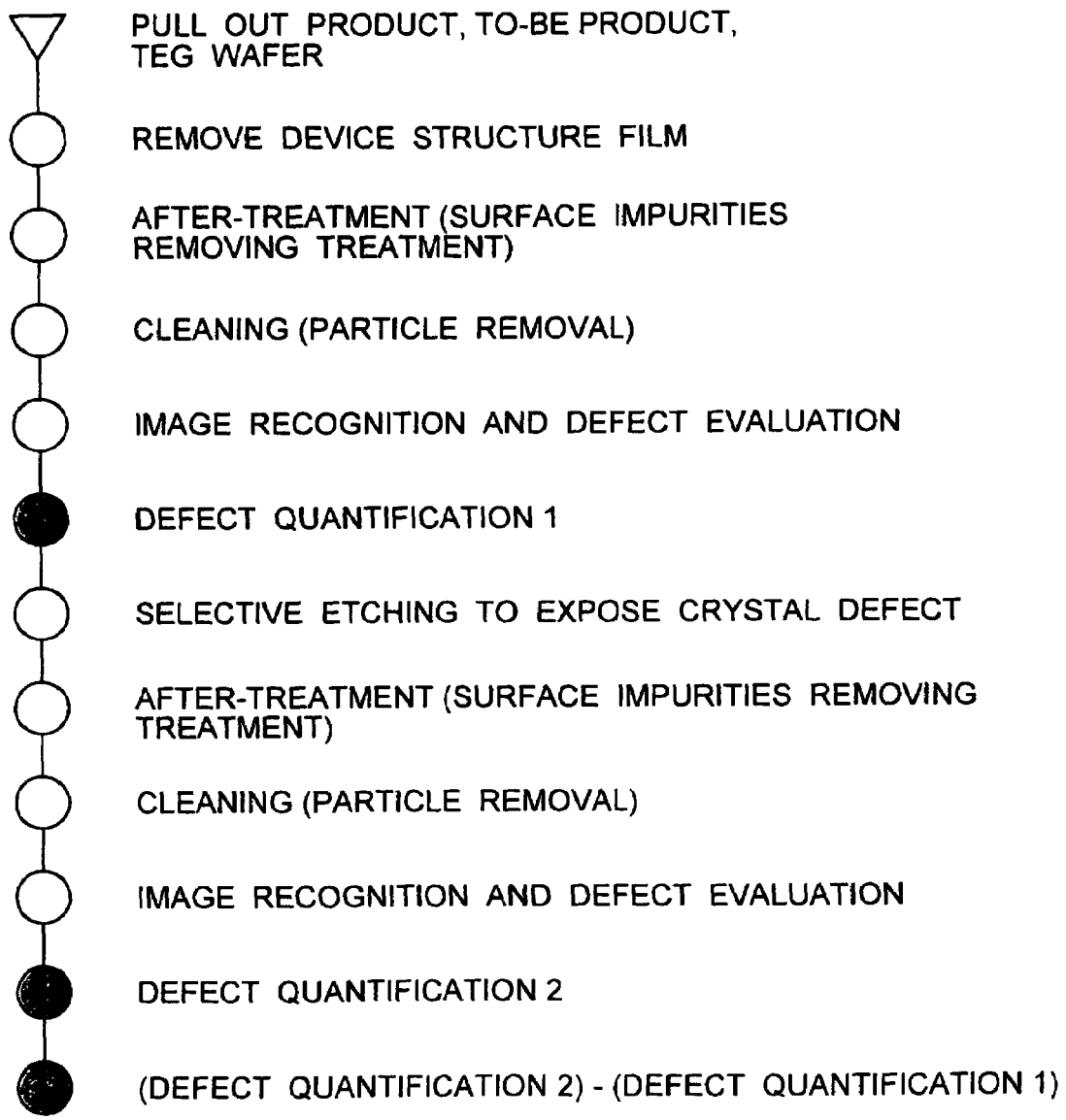
FIG. 5 is a flowchart showing a schematic procedure of the second embodiment of the semiconductor wafer inspection method according to the present invention.
Figure 6A:
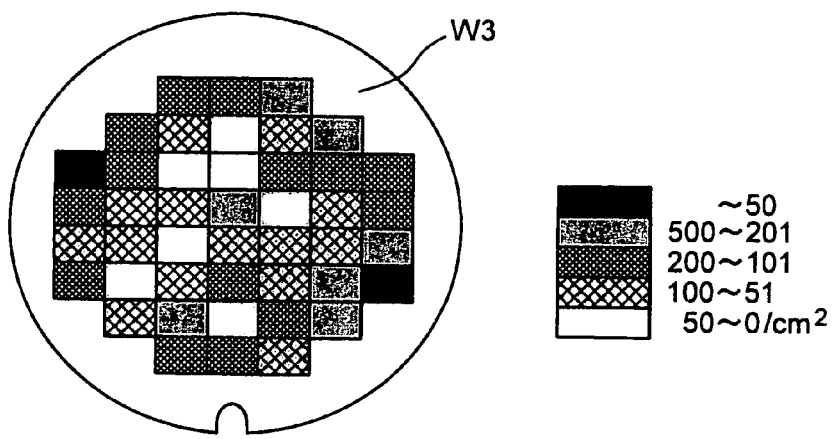
FIGS. 6A to 6C are views in which defect density of the crystal defect quantified by the inspection method shown in FIG. 5 is mapped on a semiconductor wafer.
Figure 6B:
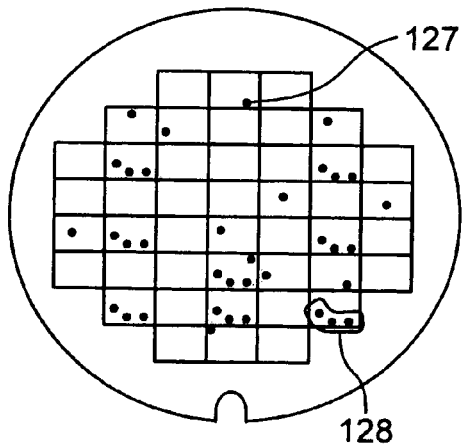
Figure 6C:
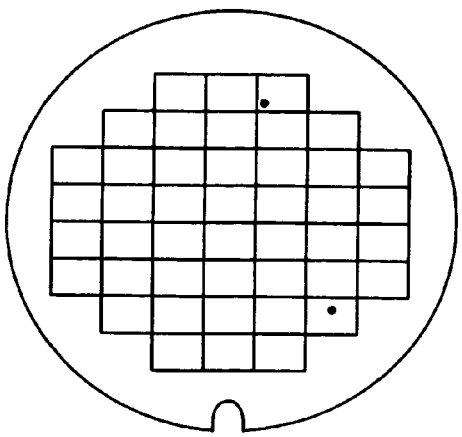

FIG. 4 is a cross sectional view showing the second embodiment of the semiconductor wafer treatment apparatus according to the present invention, and FIG. 5 is a flowchart showing a schematic procedure of the second embodiment of the semiconductor wafer inspection method according to the present invention, and further, FIGS. 6A to 6C are views in which defect density of the crystal defect quantified by the inspection method shown in FIG. 5 is mapped on a semiconductor wafer.

The treatment apparatus shown in FIG. 4 further comprises a surface state observation monitor 130 and an in-liquid particle monitor 129 used in a device structure film removal process 216, in addition to the configuration of the treatment apparatus shown in FIG. 2. The surface state observation monitor 130 is attached to the removal tank 105 of the treatment apparatus, and the in-liquid particle monitor 129 is attached to the outer tank 107 that accommodates the removal tank 119. The configuration of other parts of the treatment apparatus of the present embodiment is substantially the same as the configuration of the treatment apparatus shown in FIG. 2.

Figure 15A:
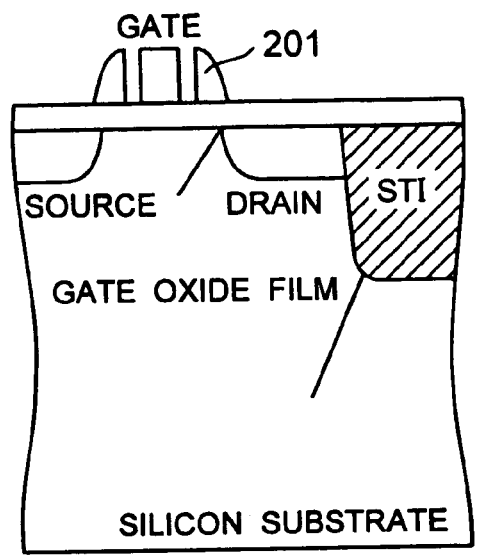
FIGS. 15A to 15C are partial cross sectional views showing one example of the semiconductor wafer to which a device structure film removing process and a selective etching process to expose crystal defects according to the inspection method shown in FIG. 14 are applied.
Figure 15B:
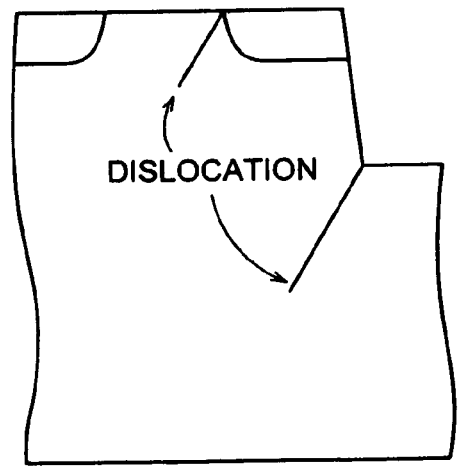
Figure 15C:
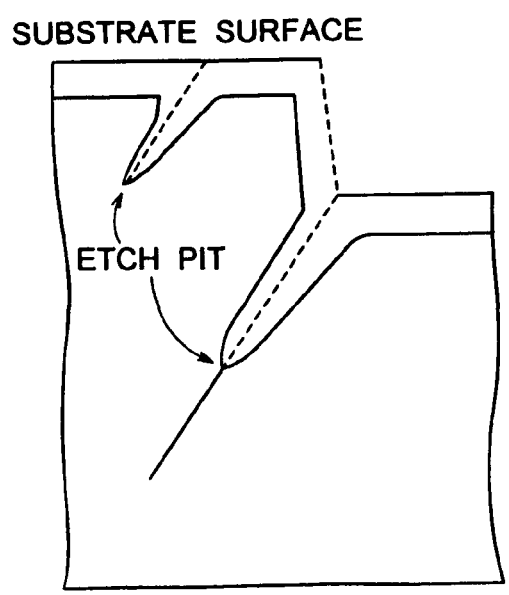

The surface state observation monitor 130 is used for end point detection so that pits other than the targeted defect etch pits are not caused on the silicon surface of the substrate while the device structure film is being removed. The targeted defect etch pits represent the etch pits (see FIG. 15C) which occur in the next crystal defect exposure etching process 117. The etch pits can be caused during the removal process depending on the kind of film and structure of the sample, and it is important to prevent this for noise reduction in the image recognition defect evaluation. This monitor 130 is, for example, an image detection device such as a CCD waterproofed with a chemical solution-proof material, and it obtains an image change in the same place during removal, and suitable removal time can be automatically set therein in such a manner that the monitor 30 is taken out from the removal liquid when the image change becomes equal to or below a certain value.

After the device structure film is removed, an removed material contained in a waste liquid is monitored by the in-liquid particle monitor 129 in the cleaning process or water cleaning process which uses ultrasonic waves so that the removed material does not remain on the semiconductor wafer surface, and then an end point of the cleaning or water cleaning is detected. Because particles are also easy to become noise for the targeted defect etch pits in the image recognition defect evaluation in FIG. 1, it is important for highly accurate defect quantification to prevent such particles from generating.

According to the present invention, accurate end point detection by the monitors 129, 130 reduces the etch pits and particles which became noise to about 10%, as compared with a case where the monitors are not used.

Next, in the process flow shown in FIG. 5, the defect is quantified in a state before the crystal defect exposure etching (defect quantification 1), and the defect is quantified in a state after the crystal defect exposure etching (defect quantification 2), and then their difference is obtained, and further the etch pits which become noise are differentiated, thus highly accurately obtaining the etch pits of the target defect to be quantified. It is possible to highly accurately make a quantification evaluation of only the etch pits caused by the selective etching for exposing crystal defects on the semiconductor wafer on which the device pattern is formed, so that the quantification evaluation can be a judgmental standard for process improvement.

FIG. 6A to FIG. 6C show an example in which the crystal defect is highly accurately quantified and improved according to the present embodiment. FIG. 6A shows an example in which a sample semiconductor wafer on which the device pattern is formed is measured by the inspection method of the present embodiment. As a result of modifying the manufacturing process on the basis of the measurement results, the crystal defects are dramatically decreased as shown in FIG. 6B. However, in the example shown in FIG. 6B, there are remaining shot defects related to a mask pattern such as a crystal defect 127 detected in the present embodiment and a defect pattern 128 having in-chip position dependency found out by the inspection according to the present embodiment. On the basis of this result, the pattern arrangement is further modified, thereby making it possible to leave almost no crystal defect in the semiconductor wafer as shown in FIG. 6C. Further, development costs including even a loss in mass production can be reduced to about 1/10.

Here, in the evaluation method shown in FIG. 1 and FIG. 5, the image recognition defect evaluation using an image recognition defect inspection device (optical detection device) will be described.

First, processes and an evaluation procedure that are common in all the embodiments are described. As a sample semiconductor wafer on which the device pattern is formed, an epitaxial wafer whose diameter is 200 mm is subjected to element separation by STI to produce in each chip one TEG whose minimum size is 0.25 um width and whose area is 0.2 cm$^2$. In a process of forming a diffusion area for relatively low concentration of impurities at an end of source/drain areas in an LDD structure, a gate conductor is formed on a gate oxide film before ions such as boron (B) are implanted in a p$^+$ diffusion area and ions such as arsenic (As) are implanted in an n$^+$ diffusion area. Next, a silicon nitride film (SiN) is deposited by LP-CVD, and then the SiN film is etched by RIE to form a sidewall. In this state, a high stress area exists in a lower part of the SiN film. Next, using a gate and the sidewall as a mask, As ions are implanted into the n$^+$ diffusion area, for example, on conditions including an accelerating voltage of 40 keV and a dose amount of 4E15 cm$^{-2}$. In a dose amount of 1E15 cm$^{-2}$, a silicon crystal lattice in an implantation area is completely amorphousized. For activation anneal of the diffusion area, rapid thermal anneal (RTA) is carried out in an N$_2$ gas atmosphere at 1000° C. or higher for 30 seconds or longer by use of a single type heater.

The etching to bring the dislocation into view is carried out by dipping for 5 seconds the silicon wafer whose film is removed in the wright liquid. It should be noted that the wafer may be etched with a Cr-less etching solution which does not contain Cr, since the wright liquid containing sexivalent Cr is hazardous. It is confirmed that such an etching solution can provide the same results as when the wright liquid containing sexivalent Cr is used. In addition, before the selective etching, an HF solution dip process for removing a thin film and a cleaning process with a sulphuric acid/hydrogen peroxide mixed solution are carried out, and after the etching, acid cleaning with a hydrochloric acid/hydrogen peroxide mixed solution and alkali cleaning with an ammonia/hydrogen peroxide mixed solution to remove minute particles and Cr are carried out in addition to the HF solution dip.

With respect to the evaluation for occurrence frequency of a dislocation, the dislocation is detected by an optical automatic defect evaluation device (automatic evaluation device), a defect is judged and extracted by image recognition and a comparison algorithm through a detection optical system and a calculator shown in the embodiments, and then the defect is observed by use of the SEM (scanning electron microscope), thus confirming that the "defect" obtained by the automatic evaluation device is the etch pits caused by the dislocation. All cells are observed in each semiconductor wafer, and the cell having a dislocation is observed to calculate dislocation density.

Figure 7:
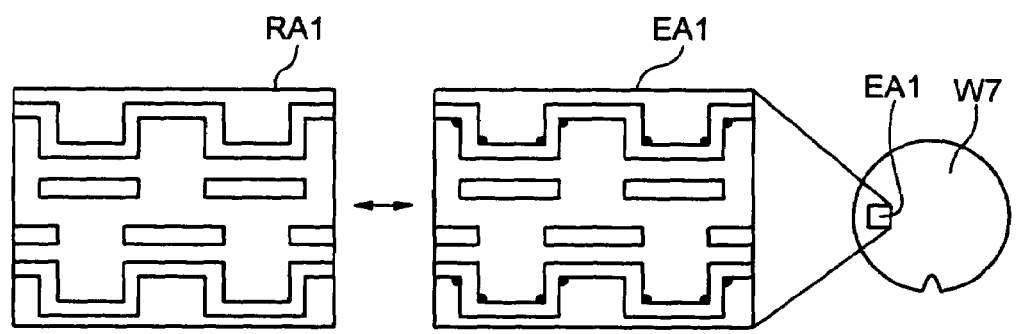
FIG. 7 is an explanatory view showing a fourth embodiment of the semiconductor wafer inspection method according to the present invention.

A basic concept common in the respective embodiments of the inspection method of the semiconductor wafer according to the present invention is to always provide a minimum area without dislocation to precede the procedure for the dislocation evaluation. In other words, prior to detection of the dislocation by use of, for example, an optical microscope after the selective etching of the silicon wafer, a reference area RA1 which becomes the evaluation standard and includes defect-free (dislocation-free) patterns has previously been formed on a silicon wafer W7 as shown in FIG. 7, and this reference area RA1 is contrasted with an evaluation area EA1 to detect crystal defects. If this procedure is applied to all the patterns in a surface of the wafer W7, all crystal defects of the wafer W7 can be detected.

According to the present embodiment, the crystal defects such as the dislocation in the evaluation area are thus detected with reference to the reference area including the defect-free device pattern, so that an evaluation can be implemented without overlooking defect portions due to periodicity of regular patterns.

In actual improvements, stress is reduced by optimizing conditions on sidewall processing, sidewall oxidation, thin film deposit, gate insulation film formation and the like, thereby enabling the dislocation to be reduced. Furthermore, by modifying conditions ranging from ion implantation to anneal process, a minute dislocation loop which is the cause of dislocation is decreased, thereby also enabling the dislocation to be reduced.

(3) Third Embodiment

Next, a third embodiment of the present invention will be described in reference to FIG. 8 and FIG. 9.

To form the dislocation-free pattern, after depositing polysilicon (poly-Si) on the gate conductor (GC), the gate conductors are all removed only from the chip which is the reference area in the semiconductor wafer by dry etching of polysilicon with CDE without applying a resist thereto. Also in the subsequent LDD process, films corresponding to the SiN sidewall are removed in processes such as RIE. As ions are implanted into the diffusion area on conditions including an accelerating voltage of 40 keV and a dose amount of 4E15 cm$^{-2}$, and RTA is carried out at 1000° C. for 30 seconds for activation anneal.

Figure 8:
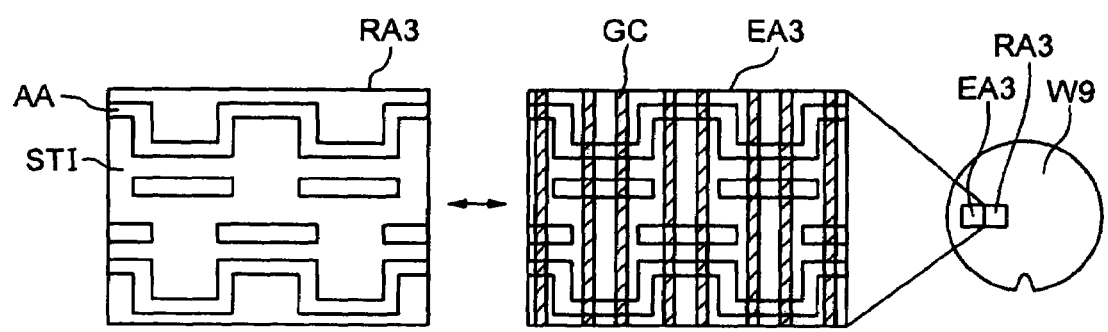
FIG. 8 is an explanatory view showing the third embodiment of the semiconductor wafer inspection method according to the present invention.

FIG. 8 shows one example evaluation wafer W9 wherein a reference area RA3 intentionally dispensed with the gate conductor GC before thin film removal and an evaluation area EA3 in which the normal gate conductor GC is formed are arranged in the surface of the semiconductor wafer. An active area and an element separation area STI (shallow trench isolation) herein are formed in common in the reference area RA3 and the evaluation area EA3, but the gate conductors (GC) indicated by slant lines are not formed in the reference area RA3 and are formed in only the evaluation area EA3. In the reference area RA3, stress is reduced by not adding the gate conductors, so as to form the defect-free device pattern.

Figure 9:
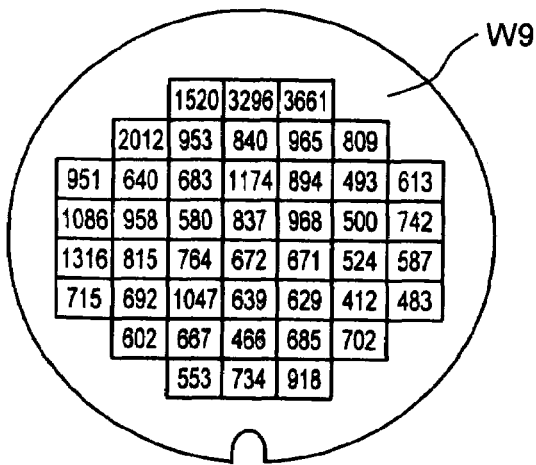
FIG. 9 is a view in which evaluation results by the third embodiment and a fifth embodiment of the semiconductor wafer inspection method according to the present invention are written on the semiconductor wafer.

One example of results of evaluation by use of the reference area RA3 is shown in FIG. 9. Distribution of the number of dislocations (the number of etch pits/0.2 cm$^2$ area) in each chip is thus marked down. When the evaluation wafer W9 is disposed so that a notch is placed at the bottom, it is found out that density is high in left side and counter-notch side areas within an outer peripheral part of the evaluation wafer W9. Since defect portions are often overlooked due to the periodicity of the regular patterns in an evaluation according to a conventional inspection method, it is concluded that some evaluation areas have 0 or several "defects", which has turned out that the conventional method involved some errors.

The case without the gate conductor has been described in connection with the present embodiment, but since stress can be reduced by not forming a contact, this kind of reference area can also be formed.

(4) Fourth Embodiment

Figure 10:
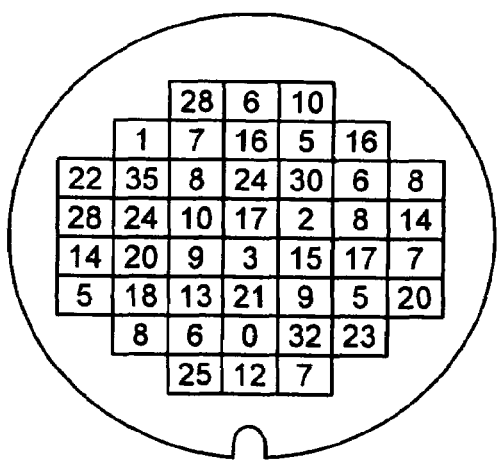
FIG. 10 is a view in which evaluation results by the fourth embodiment of the semiconductor wafer inspection method according to the present invention are written on the semiconductor wafer.

Next, a fourth embodiment will be described in reference to FIG. 7 and FIG. 10.

FIG. 7 is a plan view of the evaluation wafer W7 in which the evaluation area EA1 is disposed in the surface of the semiconductor wafer, and shows one example of the reference area RA1. An experiment is performed changing stress in a stress concentrated area in an edge portion of the gate conductor. An aim here is to evaluate the change in the dislocation occurrence with sidewall thickness of the gate conductor being increased and decreased after ion implantation.

Figure 16:
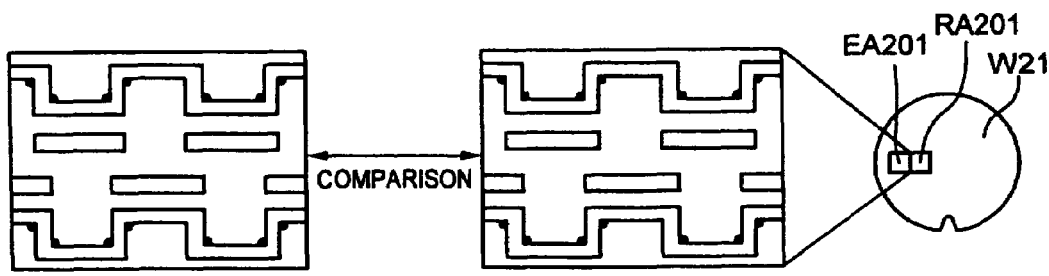
FIG. 16 is an explanatory view of the inspection method shown in FIG. 14.

As described in connection with the related art (see FIG. 16), film thickness is changed per semiconductor wafer by LP-CVD to deposit the SiN film, thereby forming a semiconductor wafer with a sidewall film thickness of 10 nm and a sidewall film thickness of 20 nm. As$^+$ ions of 40 keV and of 4E15 cm$^{-2}$ are implanted into the diffusion areas for both of the semiconductor wafers, and then, the RTA at 1000° C. for 30 seconds is applied with N$_2$ at the midpoint, thus finishing heat treatment. At this stage, the semiconductor wafer is pulled out and provided for evaluation. The evaluation result is as shown in FIG. 10, and it is found out that by decreasing the sidewall film thickness to reduce the stress in the end portion, the dislocation density can be reduced to several tenths to several hundredths.

(5) Fifth Embodiment

Next, a fifth embodiment of the present invention will be described in reference to FIG. 9 and FIG. 11.

Figure 11:
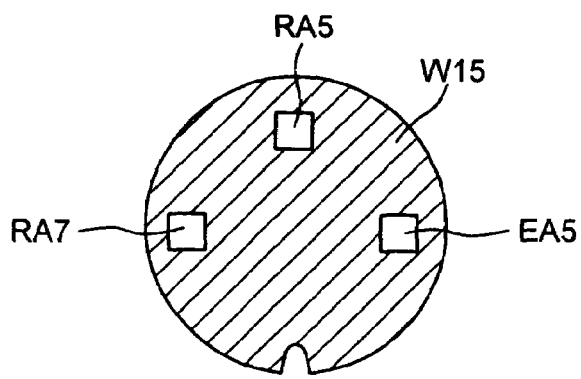
FIG. 11 is an explanatory view of the fifth embodiment of the semiconductor wafer inspection method according to the present invention.

FIG. 11 is a plan view of a wafer to be evaluated W15 in which an evaluation area EA5 and reference areas RA5, RA7 are formed.

Attention is focused on the ion implantation as a typical process to give irradiation damage to the substrate, and a defect-free pattern is formed by eliminating the ion implantation process or by reducing residual damage (micro dislocation) due to the ion implantation. The evaluation area EA5 to which ion implantation of arsenic (As) is applied is formed in almost entire surface of the semiconductor wafer W15 except for the reference areas RA5, RA7. On the other hand, the reference area RA5 is produced by implanting boron (B) ions in a dose amount of 4E15 cm$^{-2}$, and the reference area RA7 is produced in which the ion implantation is omitted. A resist is thickly applied to the reference area RA7 before ion implantation, and this is used as a mask to prevent the ion implantation into the reference area RA7, and the resist is removed by SH cleaning (sulfuric/hydrogen peroxide mixed solution treatment) after the ion implantation, and then the activation anneal is applied.

By comparing the patterns using the reference areas RA5, RA7, it is possible to obtain distribution of the number of dislocations that correspond to that shown in FIG. 9 within 20% difference. As the area RA7 to which the ion implantation is not applied, a defect-free pattern may be produced with a stencil mask instead of this process. In addition, when the processes in question that cause the dislocations are processes such as RIE and HDP which give plasma damage to the substrate, these processes are eliminated or reduced so that reference patterns similar to those with the ion implantation can also be produced, and thus dislocation evaluation is possible.

(6) Sixth Embodiment

Next, a sixth embodiment of the present invention will be described in reference to FIG. 12.

Figure 12:
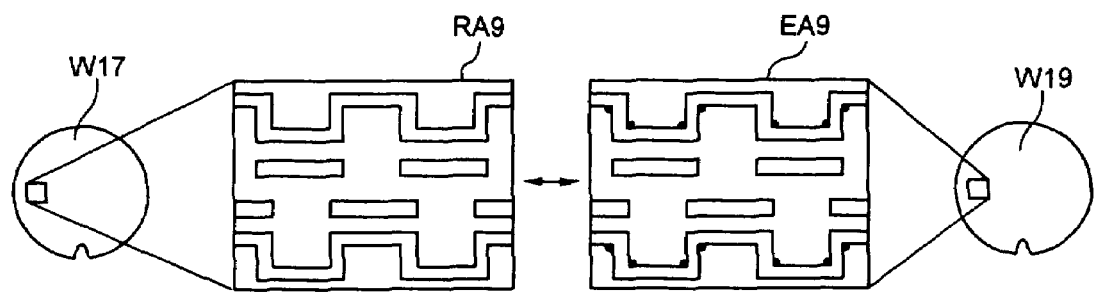
FIG. 12 is an explanatory view of the sixth embodiment of the semiconductor wafer inspection method according to the present invention.

FIG. 12 is a plan view of a semiconductor wafer W17 in which a reference area RA9 is formed and of a semiconductor wafer W19 having an evaluation area EA9. In the present embodiment, as shown in FIG. 12, the dislocation is judged by comparison between the different semiconductor wafers W17 and W19 after selective etching. Especially, the reference semiconductor wafer W17 comprising the same pattern without dislocation is formed without As ion implantation, and the areas of this semiconductor wafer W17 are used as reference standard for comparison to detect defects in corresponding areas of the evaluation wafer W19. By comparison between these semiconductor wafers, it is possible to obtain distribution of the number of dislocations that correspond to that shown in FIG. 9 within 10% difference.

(7) Seventh Embodiment

Next, a seventh embodiment of the present invention will be described.

In the present embodiment, image information on the defect-free patterns of the reference areas has previously been stored in a storage device (not shown). Actually, images of the patterns are used in which stress is reduced by intentionally forming no gate conductors GC as in the reference area RA3 of FIG. 8, but it is also possible to use images of a sample without ion implantation or a sample in which damage is reduced. Next, for the pattern of each area of each chip in the wafer to be evaluated, the same image of the same pattern previously stored is used as a reference image to compare with an evaluation image with the reference image, thereby detecting a defect. By comparison with the reference image in the storage device, it is possible to obtain distribution of the number of dislocations that correspond to that shown in FIG. 9 within 20% difference.

As described above, according to the third to seventh embodiments, the dislocation occurring in the manufacturing process of the highly integrated semiconductor device can be quantitatively evaluated as in the dislocation distribution shown in the semiconductor wafer W9 of FIG. 9. As a result, it is possible to induce measures to prevent a high leak current caused by the dislocation, thus enabling improvements in a yield ratio.

(8) Eighth Embodiment

Next, an eighth embodiment of the present invention will be described.

As previously described in the second embodiment, in the complete removal process of removing all of the device structure film from the semiconductor wafer, complete removal pits which are not dislocations might frequently occur due to the complete removal process, and residuals might be produced due to removal faults, and moreover sticking of particles (foreign particles) might be caused. Especially, no technique has been so far reported to prevent particles sticking onto the entire wafer surface. These complete removal pits, residuals and particles become noise in the quantitative measurement of dislocations using an optical defect inspection device or an electron beam defect inspection device, which poses a problem that the dislocations can not be measured accurately. Particularly, it is difficult to distinguish the occurrence of the complete removal pit from that of the dislocation, which has been a serous hindrance in accurate dislocation measurement.

The present embodiment provides a method of enabling a complete removal process without such complete removal pits, residuals and sticking particles, and also enabling the uniform selective etching in the wafer surface.

First, the semiconductor wafer on which a highly integrated semiconductor element is formed is dipped in the concentrated HF solution, and then applied to cleaning treatment with purified water (first step). Next, this semiconductor wafer is dipped in the SPM (H$_2$O$_2$:H$_2$SO$_4$=1:3) solution to remove metallic impurities such as Cu, and cleaned with water (second step). Subsequently, the semiconductor wafer is dipped in the HF solution of a 40% concentration to which the interfacial active agent is added by 1%, and then cleaned with purified water (third step). The semiconductor wafer is then dipped in a choline+$H_2O_2$ treatment liquid at room temperatur, and cleaned with water (fourth step). Subsequently, the selective etching treatment is carried out with the wright liquid. In this selective etching treatment, the semiconductor wafer is quickly dipped in the liquid in such a manner that a surface of the semiconductor wafer to be inspected is held horizontally to a surface of the wright liquid, and then the semiconductor wafer is quickly lifted to be quickly put in purified water, and is cleaned with water (fifth step). Furthermore, the semiconductor wafer is cleaned with an HCl+ozone water treatment liquid in order to remove metallic impurities such as Cr attributed to the wright liquid, and is cleaned with purified water before dried by a spinner (sixth step). The surface state of the semiconductor wafer is inspected by the SEM after finishing the processes from the above first step to sixth step, with the result that the complete removal pits, residuals due to removal faults, and particles are not found.

Next, the dislocation in this wafer is measured by use of both the optical defect inspection device and electron beam defect inspection device, and no foreign particles such as the complete removal pits, residuals and particles are found, so that the quantitative measurement of crystal defects such as dislocations can be accurately performed all over the wafer surface.

In the first and third steps described above, when $NH_4F$ is used instead of HF to perform the complete removal process, it is also possible to obtain a semiconductor wafer having a surface state with no complete removal pits, residuals and particles approximately in the same way as when HF is used, and the quantitative measurement of dislocations can be performed by use of any one of the optical defect inspection device and electron beam defect inspection device.

Furthermore, in the second step, when aqua regia ($HNO_3$: HCl=1:3) is used in place of the SPM ($H_2O_2$:$H_2SO_4$=1:3) treatment liquid, it is also possible to obtain a semiconductor wafer having nearly the same surface state as in the case of the SPM treatment liquid. No particular inconvenience is caused in the quantitative measurement of dislocations in this semiconductor wafer by use of the optical defect inspection device and electron beam defect inspection device.

When phosphoric acid ($H_3PO_4$) is used in the third step, it is also possible to obtain a semiconductor wafer having a surface state with no complete removal pits, residuals and particles approximately in the same manner as when the HF of a 40% concentration mentioned above is used, and the quantitative measurement of dislocations can be accomplished by use of the optical defect inspection device and electron beam defect inspection device.

Furthermore, in the fourth step, when the temperature for treatment with the choline+$H_2O_2$ liquid is set at 70° C. to carry out the complete removal process, the surface of the semiconductor wafer after treatment is finished approximately in the same state as when it is treated at room temperature. Moreover, when an APM solution (SC-1=$NH_4OH$:$H_2O_2$:$H_2O$=1:1:5) and a treatment liquid to which KOH is added are used instead of the choline+$H_2O_2$ treatment liquid in the fourth step, it is also possible to obtain a semiconductor wafer having almost the same surface state as when the choline+$H_2O_2$ treatment liquid is used. Also, when the HPM solution (SC-2=HCl:$H_2O_2$:$H_2O$=1:1:5) is used, the surface state of the semiconductor wafer is nearly the same. The quantitative measurement of dislocations can be accomplished for all these semiconductor wafers by use of any one of the optical defect inspection device and electron beam defect inspection device.

Furthermore, during the selective enticing with the wright liquid in the fifth step, if the semiconductor wafer is held so that its surface to be inspected is vertical to the surface of the wright liquid, and the semiconductor wafer is quickly dipped in the liquid to apply etching treatment and then quickly lifted to be cleaned in purified water, the shape and size of the dislocations brought into view are different in the semiconductor wafer, and moreover, inconvenience is caused in the quantitative measurement of the entire semiconductor wafer surface even by use of any one of the optical defect inspection device and electron beam defect inspection device.

In the sixth step for the post-treatment after the elective etching, when the HPM solution (SC-2=HCl:$H_2O_2$:$H_2O$=1:1:5) is used instead of the HCl+ozone water treatment liquid, an amount of metallic impurities such as Cr and the surface state of the wafer are approximately the same as when the HCl+ozone water treatment liquid is used, and no inconvenience is caused in the dislocation measurement by use of any one of the optical defect inspection device and electron beam defect inspection device.

Furthermore, when the third step is replaced with the first step to carry out treatment, the semiconductor wafer has only a few complete removal pits, residuals and particles, and no inconvenience is caused in the dislocation measurement by use of any one of the optical defect inspection device and electron beam defect inspection device.

Figure 13:
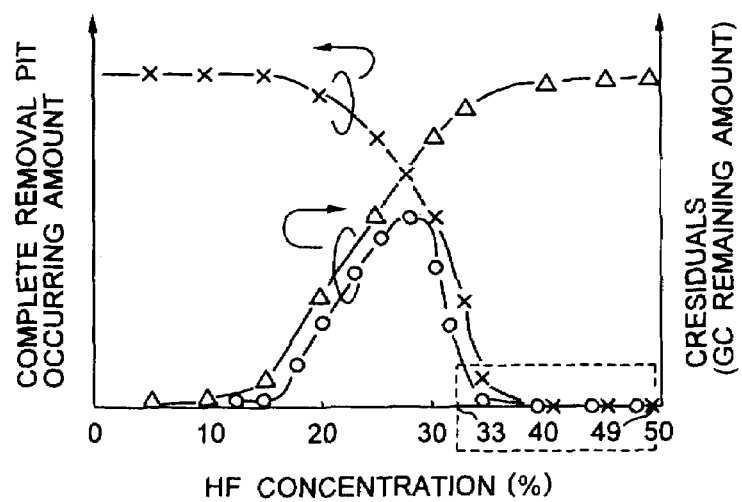
FIG. 13 is a graph showing a relationship among HF concentration, a complete removal pit and residuals in one embodiment of the semiconductor wafer treatment method according to the present invention.
Figure 14:
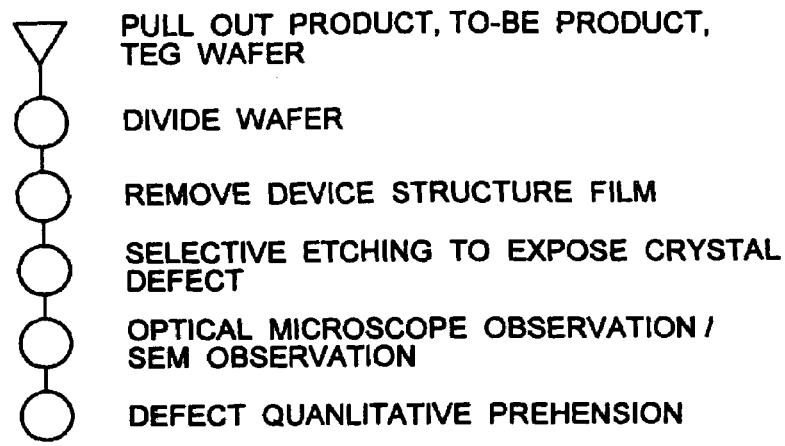
FIG. 14 is a flowchart showing one example of the semiconductor wafer inspection method according to a related art.

FIG. 13 shows a relationship among HF concentration, the complete removal pit and residuals obtained from the experiment of the present embodiment. As shown in FIG. 13, it is found out that the complete removal pit occurs with a HF concentration of below 33%, and it depends on dipping time at 33% or higher but the complete removal pit does not occur within a time required for the complete removal process. On the other hand, more residuals (remaining GC) are left at higher HF concentration. This is because the complete removal pit and residuals have a trade-off relationship. It is found out, however, that the residuals can also be prevented by applying alkali treatment or similarly effective alkali- or acid-based treatment in the above fourth step and applying ultrasonic wave treatment in any of the above first step to sixth step or in its water cleaning treatment. Thus, because of the alkali- or acid-based treatment at an HF concentration of 33 to 49% and ultrasonic wave application in the above fourth step, it is possible to find conditions for the complete removal process free of complete removal pits and residuals.

The present embodiment enables the complete removal process free of the complete removal pits, residuals due to removal faults, particles and the like in the semiconductor wafer on which a semiconductor element is formed and also enables the uniform selective etching in the wafer surface, so that crystal defects in the entire semiconductor wafer surface can be quantitatively inspected with high accuracy. This makes it possible to clarify the cause of dislocation attributed to the process that leads to a lower yield ratio of mass production, thus contributing to improvements in the yield ratio.

It should be noted that the steps are ordered in the present embodiment for convenience of description, but the present invention is not limited to the above-mentioned order, and the order can be arbitrarily changed and scone of them can be properly omitted.

(9) Ninth Embodiment

Next, a ninth embodiment of the present invention will be described.

In the present embodiment, defects in the semiconductor wafer surface is first quantitatively evaluated using any one of the inspection methods described in the first to eighth embodiments, and on the basis of this quantified information on defects, the manufacturing process or the shape of the device pattern is optimized so that the number of crystal defects decreases. For example, treatment conditions for the manufacturing process include reduction of ion implantation damage and improvements of anneal conditions after ion implantation. The shape of the device pattern is improved, for example, by changing a bending pattern to a linear pattern. These measures make it easy to develop a technique to reduce dislocation occurrence in the device manufacturing process, and make it possible to reduce development costs and significantly shorten a development period. By using the quantitative data on defects as a judgmental standard for manufacturing process improvements in this way, crystal defects can be reduced, and development costs including even a loss in mass production can be reduced to about 1/10, and also the development period can be significantly shortened. Further, since occurrence of harmful dislocations can be reduced by manufacturing semiconductor devices in such an improved process, highly accurate semiconductor devices can be manufactured with a high yield ratio.

What is claimed is:

1. A method of inspecting a semiconductor wafer which comprises a film constituting a device structure including a device pattern and which may have a crystal defect, the method comprising:
   removing said film constituting a device structure including a device pattern with a chemical solution to expose the crystal surface of the semiconductor wafer;
   selectively removing a surface layer of the semiconductor wafer by selective etching without dicing to bring the crystal defect into view; and
   quantitatively evaluating the crystal defect.

2. The method of inspecting the semiconductor wafer according to claim 1,
   wherein said chemical solution includes a first solution having at least one kind of an oxidative acid and an oxidizing agent and a second solution having at least one of HF and $NH_4F$.

3. The method of inspecting the semiconductor wafer according to claim 1,
   wherein said chemical solution includes a first solution having at least one of $NH_4F$ and HF whose concentration is equal to or more than 33% and less than 49% and a second solution having at least one of an alkali, an oxidative acid and HF.

4. The inspection method of the semiconductor wafer according to claim 1, further comprising:
   removing contaminants produced on a surface of the semiconductor wafer due to said selective etching.

5. The inspection method of the semiconductor wafer according to claim 1, further comprising:
   cleaning the semiconductor wafer so as to remove particles produced on the surface of the semiconductor wafer in the treatments up to said selective etching.

6. The inspection method of the semiconductor wafer according to claim 1,
   wherein removing said film includes at least one execution of removing said film with a chemical solution composed of HF, $H_2O$ and an interfacial active agent, and of removing residuals through etching by use of $H_2SO_4$, $H_2O_2$ and $H_2O$.

7. The inspection method of the semiconductor wafer according to claim 1,
   wherein said selective etching is carried out using one of a solution of chromic oxide (VI), fluorine, nitric acid, acetic acid and copper nitrate (II) trihydrate, a solution of chromic oxide (VI) and fluorine, and a solution of fluorine, nitric acid and acetic acid.

8. The inspection method of the semiconductor wafer according to claim 1,
   wherein quantitatively evaluating the crystal defect includes:
   creating in advance a reference area including a defect-free device pattern on the semiconductor wafer; and
   detecting the crystal defect by obtaining an image to be evaluated which is an image of an area to be evaluated and a reference image which is an image of said reference area and comparing the image to be evaluated with the reference image.

9. The inspection method of the semiconductor wafer according to claim 8,
   wherein said defect-free device pattern is formed by reducing stress.

10. The inspection method of the semiconductor wafer according to claim 9,
    wherein a gate conductor or a contact is formed in the area to be evaluated and said stress is reduced by forming no gate conductors and no contacts in said reference area.

11. The inspection method of the semiconductor wafer according to claim 8,
    wherein said area to be evaluated is formed in a process including irradiation of charged particles, and said defect-free device pattern is formed by avoiding or reducing damage due to irradiation of the charged particles in said reference area.

12. The inspection method of the semiconductor wafer according to claim 1, further comprising:
    creating in advance a reference semiconductor wafer having a defect-free area in which the same pattern as the device pattern formed in the semiconductor wafer to be inspected is formed;
    wherein quantitatively evaluating the crystal defect includes detecting the crystal defect by obtaining an image to be evaluated which is an image of an area to be evaluated and a reference image which is an image of the reference area, and comparing said image to be evaluated with said reference image.

13. The inspection method of the semiconductor wafer according to claim 1, further comprising:
    using a reference semiconductor wafer having a defect-free reference area in which the same pattern as the device pattern formed in the semiconductor wafer to be inspected is formed, so as to obtain in advance and store image information of the reference area;
    wherein quantitatively evaluating the crystal defect includes obtaining an image to be evaluated which is an image of an area to be evaluated and a reference image which is an image of the reference area, and comparing said image to be evaluated with said reference image to detect the crystal defect.

14. The inspection method of the semiconductor wafer according to claim 1, further comprising:
    exposing the semiconductor wafer to ultrasonic waves when removing said film with the chemical solution.

15. A method of developing a semiconductor device, comprising:

removing a film with a chemical solution, said film being formed on a crystal surface of a semiconductor wafer which may have a crystal defect, and said film constituting a device structure including a device pattern, so that the crystal surface of the semiconductor wafer is exposed;

selectively removing a surface layer of the semiconductor wafer by selective etching to bring the crystal defect into view, quantitatively evaluating the crystal defect over the entire semiconductor wafer; and optimizing a manufacturing process for the semiconductor device or the shape of said device pattern on the basis of information on the crystal defect obtained from said quantitative evaluation so that the crystal defect is reduced.

16. The method of developing the semiconductor device according to claim 15, wherein said chemical solution includes a first solution having at least one kind of an oxidative acid and an oxidizing agent and a second solution having at least one of HF and NH4F.

17. The method of developing the semiconductor device according to claim 15, wherein said chemical solution includes a first solution having at least one of NH4F and HF whose concentration is equal to or more than 33% and less than 49% and a second solution having at least one of an alkali, an oxidative acid and HF.

18. A treatment method of a semiconductor wafer, the treatment method comprising:

treating a semiconductor wafer which comprise a film constituting a device structure including a device pattern in a first solution including at least one kind of an oxidative acid and an oxidizing agent;

treating the semiconductor wafer in a second solution including at least one of HF and $NH_4F$; and treating the semiconductor wafer in a third solution including at least one of an alkali, an oxidative acid and HF.

19. The treatment method of the semiconductor wafer according to claim 18, wherein the third solution is an alkaline solution including at least one of choline, ammonia water and KOH.

20. A treatment method of a semiconductor wafer, the treatment method comprising:

treating a semiconductor wafer which comprise a film constituting a device structure including a device pattern in a first solution including at least one kind of an oxidative acid and an oxidizing agent;

treating the semiconductor wafer in a second solution including at least one of HF and $NH_4F$;

selectively etching the semiconductor wafer with a selective etching solution; and cleaning the semiconductor wafer after the selective etching is finished.

21. A treatment method of a semiconductor wafer, the treatment method comprising:

treating a semiconductor wafer which comprise a film constituting a device structure including a device pattern in a first solution including at least one kind of an oxidative acid and an oxidizing agent;

treating the semiconductor wafer in a second solution including at least one of HF and $NH_4F$;

treating the semiconductor wafer in a third solution including at least one of an alkali, an oxidative acid and HF; and wherein the second solution is an HF solution having a concentration of equal to or more than 33% and less than 49%.

22. A method of inspecting a semiconductor wafer which comprises a film constituting a part of a device structure including a device pattern and which may have a crystal defect, the method comprising:

removing said film constituting a part of a device structure including a device pattern with a chemical solution to expose a crystal surface of the semiconductor wafer;

selectively removing a surface layer of the semiconductor wafer by selective etching without dicing to bring the crystal defect into view; and quantitatively automatically evaluating the crystal defect.

23. A method of developing a semiconductor device, comprising:

removing a film with a chemical solution, said film being formed on a crystal surface of a semiconductor wafer which may have a crystal defect, and said film constituting a part of a device structure including a device pattern, so that the crystal surface of the semiconductor wafer is exposed;

selectively removing a surface layer of the semiconductor wafer by selective etching to bring the crystal defect into view;

quantitatively automatically evaluating the crystal defect over the entire semiconductor wafer; and optimizing a manufacturing process for the semiconductor device or a shape of said device pattern on a basis of information on the crystal defect obtained from said quantitative evaluation so that the crystal defect is reduced.

* * * * *

UNITED STATES PATENT AND TRADEMARK OFFICE
CERTIFICATE OF CORRECTION

| | | |
|---|---|---|
| PATENT NO. | : 7,314,766 B2 | Page 1 of 1 |
| APPLICATION NO. | : 10/706090 | |
| DATED | : January 1, 2008 | |
| INVENTOR(S) | : Sugamoto et al. | |

It is certified that error appears in the above-identified patent and that said Letters Patent is hereby corrected as shown below:

Claim 16, column 17, line 24, change "NH4F." to --$NH_4F$.--

Claim 17, column 17, line 28, change "NH4F" to --$NH_4F$--.

Signed and Sealed this

Twenty-seventh Day of May, 2008

JON W. DUDAS
*Director of the United States Patent and Trademark Office*